United States Patent
Ohtsu et al.

(10) Patent No.: US 8,912,079 B2
(45) Date of Patent: Dec. 16, 2014

(54) COMPOUND SEMICONDUCTOR DEPOSITION METHOD AND APPARATUS

(75) Inventors: Motoichi Ohtsu, Tokyo (JP); Takashi Yatsui, Tokyo (JP); Tadashi Kawazoe, Tokyo (JP); Shunsuke Yamazaki, Tokyo (JP); Koichi Kajiyama, Kanagawa (JP); Michinobu Mizumura, Kanagawa (JP); Keiichi Ito, Kanagawa (JP)

(73) Assignees: The University of Tokyo, Tokyo (JP); V Technology Co., Ltd., Yokohama-shi, Kanagawa (JP)

( * ) Notice: Subject to any disclaimer, the term of this patent is extended or adjusted under 35 U.S.C. 154(b) by 165 days.

(21) Appl. No.: 13/266,337

(22) PCT Filed: Apr. 28, 2010

(86) PCT No.: PCT/JP2010/003067
§ 371 (c)(1), (2), (4) Date: Oct. 26, 2011

(87) PCT Pub. No.: WO2010/125821
PCT Pub. Date: Nov. 4, 2010

(65) Prior Publication Data
US 2012/0058627 A1    Mar. 8, 2012

(30) Foreign Application Priority Data
May 1, 2009    (JP) .................................. 2009-112126

(51) Int. Cl.
*H01L 21/20*    (2006.01)
*B05C 9/08*    (2006.01)
(Continued)

(52) U.S. Cl.
CPC ............. *C23C 16/481* (2013.01); *C23C 16/303* (2013.01); *C30B 25/00* (2013.01);
(Continued)

(58) Field of Classification Search
USPC ................. 257/E21.09, E21.53, E29.089, 76; 438/478, 46, 45, 510, 503, 507
See application file for complete search history.

(56) References Cited

U.S. PATENT DOCUMENTS 4,885,260 A * 12/1989 Ban et al. .......................... 117/92
4,962,057 A * 10/1990 Epler et al. ....................... 148/33
(Continued)

FOREIGN PATENT DOCUMENTS

| JP | 61-256716 A | 11/1986 |
| JP | 1-181413 A | 7/1989 |

(Continued)

OTHER PUBLICATIONS

Fujita, et. al. "Gas-Phase and Surface Reactions in Xenon Lamp-Assisted Organometallic Vapor-Phase Epitaxy of ZnSe", Jap. J. Appl. Phys. vol. 27, No. 11, 1988, L2010-L2021.*

(Continued)

*Primary Examiner* — Thao X Le
*Assistant Examiner* — Sheng Zhu
(74) *Attorney, Agent, or Firm* — Holtz, Holtz, Goodman & Chick PC

(57) ABSTRACT

Provided is a compound semiconductor deposition method of adjusting the luminous wavelength of a compound semiconductor of a ternary or higher system in a nanometer order in depositing the compound semiconductor on a substrate. In the compound semiconductor deposition method of depositing a compound semiconductor of a ternary or higher system on a substrate, propagation light of a smaller energy than a desired ideal excitation energy for the compound semiconductor is irradiated onto the substrate 13 while depositing the compound semiconductor on the substrate 13, near-field light is generated based on the irradiated propagation light from fine particles of the compound semiconductor deposited on the substrate 13, new vibrational levels for the compound semiconductor are formed in multiple stages based on the generated near-field light, and a component in the compound semiconductor corresponding to the excitation energy is excited with the propagation light through a vibrational level, among the new vibrational levels, which has an excitation energy equal to or smaller than the energy of the propagation light is excited to desorb the component.

6 Claims, 7 Drawing Sheets

(51) Int. Cl.
- C23C 16/48 (2006.01)
- C23C 16/30 (2006.01)
- C30B 25/00 (2006.01)
- C30B 29/40 (2006.01)
- H01L 21/02 (2006.01)
- H01L 33/00 (2010.01)
- C23C 14/54 (2006.01)
- C23C 16/52 (2006.01)

(52) U.S. Cl.
CPC .......... *C30B 29/403* (2013.01); *H01L 21/0237* (2013.01); *H01L 21/0242* (2013.01); *H01L 21/0254* (2013.01); *H01L 21/0262* (2013.01); *H01L 33/0062* (2013.01); *C23C 14/548* (2013.01); *C23C 16/52* (2013.01)
USPC .. 438/478; 257/76; 257/E21.09; 257/E21.53; 257/E29.089; 438/46; 438/45; 438/510; 438/503; 438/507

(56) References Cited

U.S. PATENT DOCUMENTS

| | | | | |
|---|---|---|---|---|
| 5,273,932 | A | * | 12/1993 | Sugiura et al. ............... 117/103 |
| 5,354,708 | A | * | 10/1994 | Taskar et al. .................. 117/84 |
| 5,401,357 | A | | 3/1995 | Okuhira et al. |
| 5,728,425 | A | * | 3/1998 | Ebe et al. .................... 427/248.1 |
| 6,475,923 | B1 | * | 11/2002 | Mitamura .................... 438/758 |
| 6,479,313 | B1 | * | 11/2002 | Ye et al. ......................... 438/47 |
| 6,737,367 | B1 | * | 5/2004 | Drechsler et al. ............. 438/795 |
| 7,419,887 | B1 | * | 9/2008 | Quick et al. ................... 438/479 |
| 2003/0030800 | A1 | * | 2/2003 | Golden et al. ................ 356/301 |

FOREIGN PATENT DOCUMENTS

| | | |
|---|---|---|
| JP | 4-299521 A | 10/1992 |
| JP | 4-299522 A | 10/1992 |
| JP | 4-364039 A | 12/1992 |
| JP | 5-82490 A | 4/1993 |
| JP | 7-44154 B2 | 5/1995 |
| JP | 2004-277813 A | 10/2004 |
| JP | 2005-526908 A | 9/2005 |
| JP | 2006-310819 A | 11/2006 |
| JP | 2007-44871 A | 2/2007 |
| JP | 2007-165805 A | 6/2007 |
| JP | 2007-258468 A | 10/2007 |
| WO | WO 03/087431 A2 | 10/2003 |

OTHER PUBLICATIONS

International Search Report dated Jun. 8, 2010 issued in International Appln. No. PCT/JP2010/003067.

S. Yamazaki et al; Room-Temperature Growth of UV-Emitting GaN With a Hexagonal Crystal-Structure Using Photochemical Vapor Deposition; The Japan Society of Applied Physics, 2008; 3 pages.

M. Ohtsu et al; Fundamental of Nano-Photonics; By Ohmsha Ltd. 2006; pp. 141 and 206-208.

\* cited by examiner

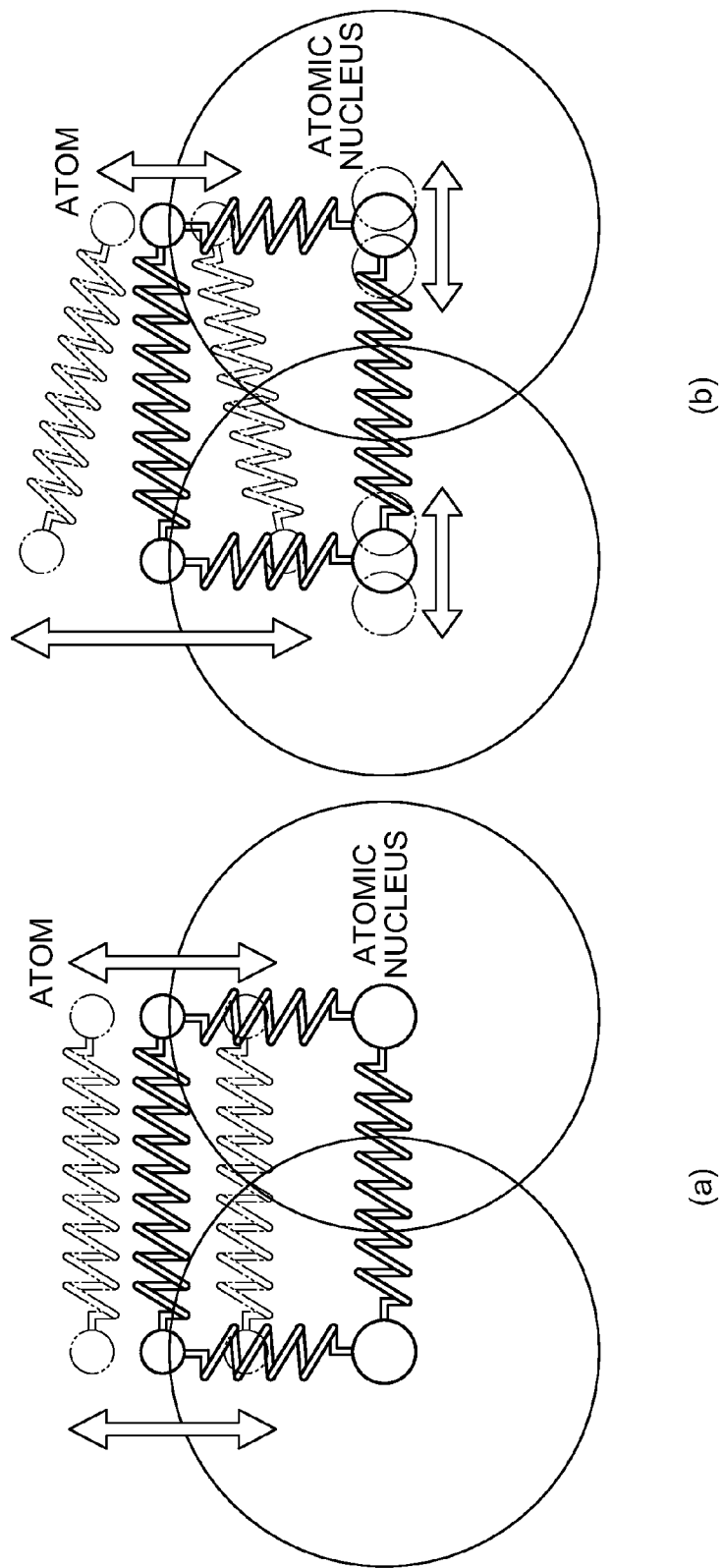

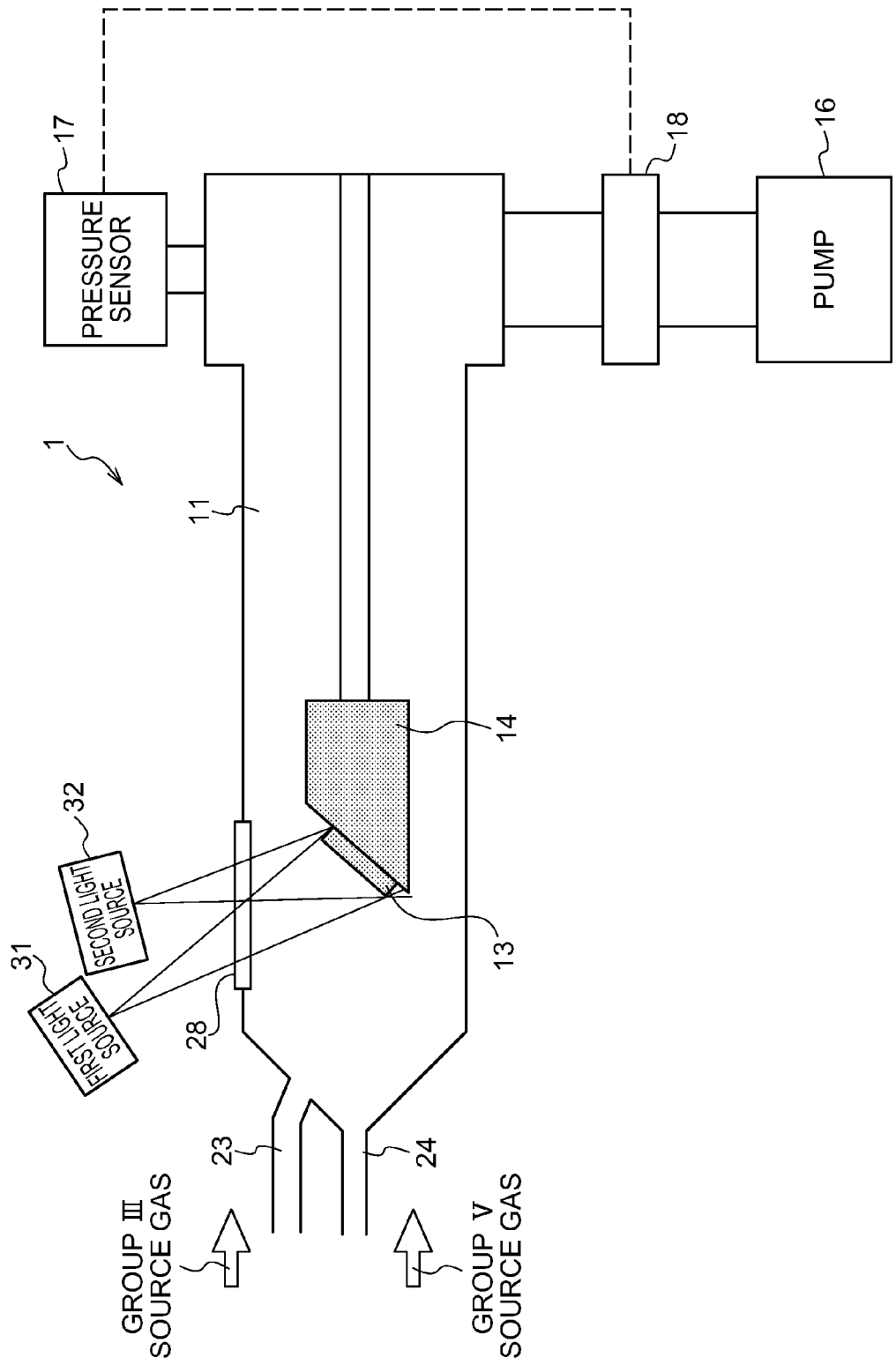

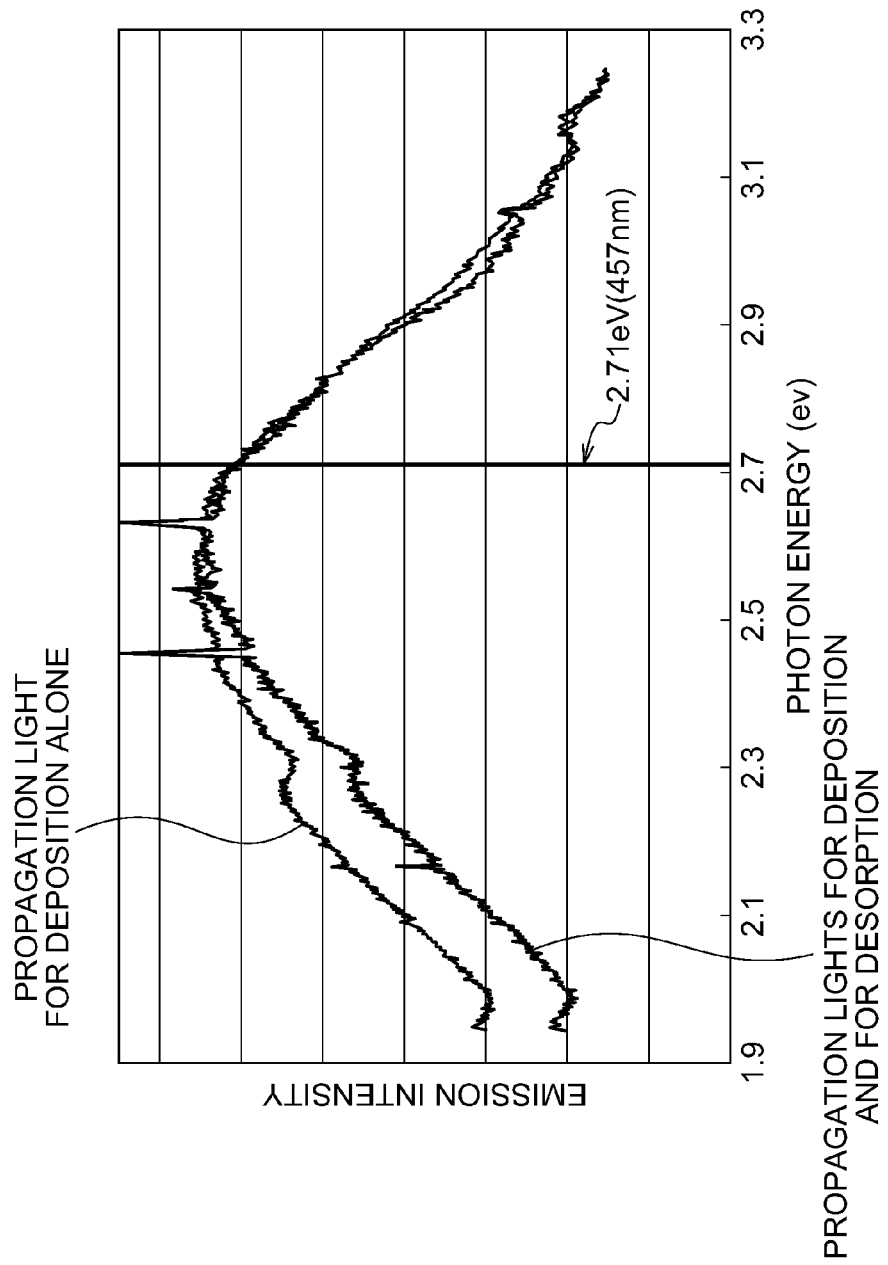

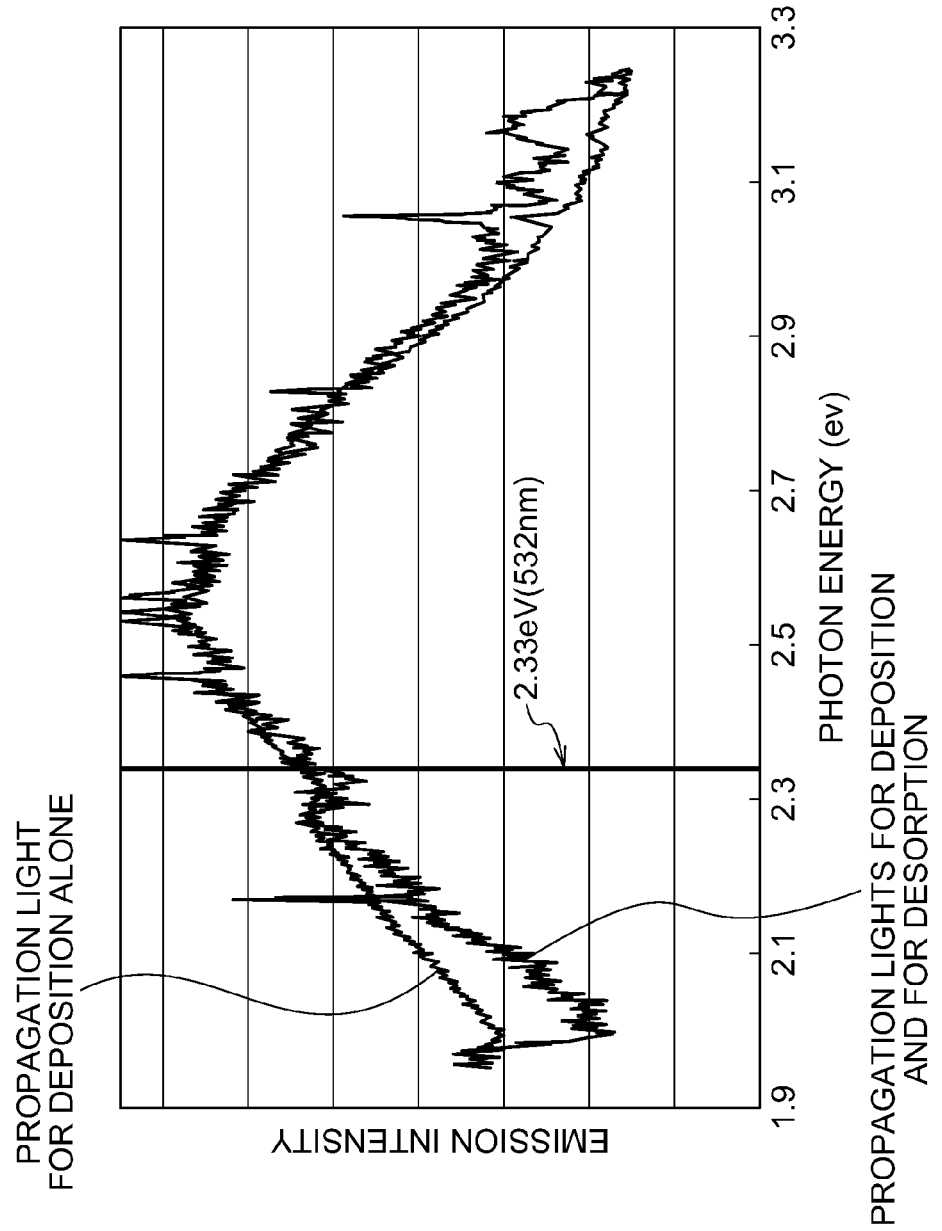

US 8,912,079 B2

COMPOUND SEMICONDUCTOR DEPOSITION METHOD AND APPARATUS

This application is a U.S. National Phase Application under 35 USC 371 of International Application PCT/JP2010/003,067 filed Apr. 28, 2010.

BACKGROUND OF THE INVENTION

1. Field of the Invention

The present invention relates to a compound semiconductor deposition method of depositing a compound semiconductor of a ternary or higher system on a substrate by using photo CVD, thermal CVD, MBE or the like.

2. Description of the Related Art

Attention has been paid to gallium nitride compound semiconductors of a ternary or higher system, such as indium gallium nitride (InGaN) having In blended in gallium nitride (GaN) and gallium aluminum nitride (GaAlN) having Al blended in GaN, as semiconductor materials for monochromatic LEDs having arbitrary luminous wavelengths like wavelengths of blue light and white light (see, for example, Patent Document 1).

When the luminous wavelength of such a compound semiconductor of a ternary or higher system which constitutes an LED shifts even by 1 nm, the color tone (or hue) of an RGB image obtained as a consequence changes. With the aforementioned InGaN as an example of the compound semiconductor of a ternary or higher system used for an LED, the luminous wavelength of InGaN changes according to the blend ratio of In into GaN. While the luminous wavelength of GaN is about 400 nm, for example, the luminous wavelength of InN is about 1.5 μm. That is, in case of the InGaN, a compound semiconductor with a desired luminous wavelength in the range of the wavelength band of 400 nm to 1.5 μm can be obtained according to the blend ratio of In. When the blend ratio of In slightly changes, on the other hand, the luminous wavelength of a compound semiconductor to be obtained changes significantly.

Conventionally, the blend ratio of In cannot be controlled with high accuracy, so that a deviation of the luminous wavelength in a nanometer-order cannot be overcome. This makes it difficult to improve the yield of LEDs to be manufactured.

PRIOR ART DOCUMENTS

Patent Document

Patent document 1: Japanese Unexamined Patent Publication No. 2006-310819).

Non-Patent Document

Non-patent document 1: "Fundamental of Nano-photonics" by Motoichi Ohtsu and Kiyoshi Kobayashi, published by Ohmsha Ltd., p 141, pp. 206-208 (2006))

SUMMARY OF THE INVENTION

Problems to be Solved by the Invention

Accordingly, the present invention has been devised in view of the problems described above, and it is an object of the present invention to provide a compound semiconductor deposition method of adjusting the luminous wavelength of a compound semiconductor of a ternary or higher system in a nanometer order in depositing the compound semiconductor on a substrate, and an apparatus.

Means for Solving the Problems

The present inventor made intensive studies in order to solve the problems described above, and as a result, he paid attention to a point that as propagation light irradiated onto a substrate while depositing a compound semiconductor on the substrate, near-field light is generated based on the propagation light from fine particles of the compound semiconductor deposited on the substrate. And, he also paid attention to a point that the generation of this near-field light can permit new vibrational levels for the to-be-deposited compound semiconductor to be formed in multiple stages. The formation of the new vibrational level in multiple stages can excite a component corresponding to an excitation energy equal to or smaller than the energy of the propagation light through the vibrational level, thereby desorbing the component.

To solve the problems described above, in a compound depositing method of depositing a compound semiconductor of a ternary or higher system on a substrate, the compound semiconductor deposition method according to Claim 1 comprises irradiating propagation light of a smaller energy than an excitation energy computed from an element ratio of the compound semiconductor onto the substrate while depositing the compound semiconductor on the substrate, and exciting a component in the compound semiconductor which corresponds to an excitation energy equal to or smaller than an energy of the propagation light with the propagation light, thereby desorbing the component.

To solve the problems described above, in a compound semiconductor deposition method of depositing a compound semiconductor of a ternary or higher system on a substrate, the compound semiconductor deposition method according to Claim 2 comprises irradiating propagation light of a smaller energy than an excitation energy computed from an element ratio of the compound semiconductor onto the substrate while depositing the compound semiconductor on the substrate, and generating near-field light based on the irradiated propagation light from fine particles of the compound semiconductor deposited on the substrate, forming new vibrational levels for the compound semiconductor in multiple stages based on the generated near-field light, and exciting a component in the compound semiconductor which corresponds to the excitation energy with the propagation light through a vibrational level, among the new vibrational levels, which has an excitation energy equal to or smaller than an energy of the propagation light, thereby desorbing the component.

To solve the problems described above, in a compound semiconductor deposition method of depositing a compound semiconductor of a ternary or higher system on a substrate by promoting a photochemical reaction through irradiation of propagation light for deposition to a gas supplied into a reaction chamber, the compound semiconductor deposition method according to Claim 3 comprises irradiating propagation light for desorption of a smaller energy than an excitation energy computed from an element ratio of the compound semiconductor onto the substrate while depositing the compound semiconductor on the substrate, and generating near-field light based on the irradiated propagation light for deposition from fine particles of the compound semiconductor deposited on the substrate, forming new vibrational levels for the compound semiconductor in multiple stages based on the generated near-field light, and exciting a component in the compound semiconductor which corresponds to the excitation energy with the propagation light for desorption through a vibrational level, among the new vibrational levels, which has an excitation energy equal to or smaller than an energy of the propagation light for desorption, thereby desorbing the component.

To solve the problems described above, in a compound semiconductor deposition apparatus for depositing a compound semiconductor of a ternary or higher system on a substrate, the compound semiconductor deposition method according to Claim 4 is characterized in that the apparatus irradiates propagation light of a smaller energy than an excitation energy computed from an element ratio of the compound semiconductor onto the substrate while depositing the compound semiconductor on the substrate, and that it excites a component in the compound semiconductor which corresponds to an excitation energy equal to or smaller than an energy of the propagation light with the propagation light, thereby desorbing the component.

To solve the problems described above, in a compound semiconductor deposition apparatus for depositing a compound semiconductor of a ternary or higher system on a substrate, the compound semiconductor deposition apparatus according to Claim 5 is characterized in that the apparatus irradiates propagation light of a smaller energy than an excitation energy computed from an element ratio of the compound semiconductor onto the substrate while depositing the compound semiconductor on the substrate, generates near-field light based on the irradiated propagation light from fine particles of the compound semiconductor deposited on the substrate, forms new vibrational levels for the compound semiconductor in multiple stages based on the generated near-field light, and excites a component in the compound semiconductor which corresponds to the excitation energy with the propagation light through a vibrational level, among the new vibrational levels, which has an excitation energy equal to or smaller than an energy of the propagation light, thereby desorbing the component.

To solve the problems described above, in a compound semiconductor deposition apparatus for depositing a compound semiconductor of a ternary or higher system on a substrate by promoting a photochemical reaction through irradiation of propagation light for deposition to a gas supplied into a reaction chamber, the compound semiconductor deposition apparatus irradiates propagation light for desorption of a smaller energy than an excitation energy computed from an element ratio of the compound semiconductor onto the substrate while depositing the compound semiconductor on the substrate, generates near-field light based on the irradiated propagation light for deposition from fine particles of the compound semiconductor deposited on the substrate, forms new vibrational levels for the compound semiconductor in multiple stages based on the generated near-field light, and excites a component in the compound semiconductor which corresponds to the excitation energy with the propagation light for desorption through a vibrational level, among the new vibrational levels, which has an excitation energy equal to or smaller than an energy of the propagation light for desorption, thereby desorbing the component.

Effect of the Invention

According to the compound semiconductor deposition method to which the invention is adapted, propagation light of an energy $E_p$ smaller than an excitation energy $E_i$ computed from the element ratio of the compound semiconductor is irradiated onto the substrate while depositing the compound semiconductor on the substrate to generate near-field light based on the irradiated propagation light from the fine particles of the compound semiconductor deposited on the substrate. Then, new vibrational levels for the compound semiconductor are formed in multiple stages based on the generated near-field light, and the compound semiconductor is excited with the propagation light through a vibrational level, among the new vibrational levels, which has an excitation energy $E_q$ equal to or smaller than the energy $E_p$ of the propagation light. As a result, a component in the compound semiconductor corresponding to the excitation energy $E_q$ is excited with the propagation light so as to be desorbed, and eventually, a component corresponding to an energy smaller than the ideal excitation energy $E_i$ can be removed.

In addition, according to the invention, the element ratio can be controlled specifically by irradiating propagation light having a smaller energy than every ideal excitation energy. Further, since a compound semiconductor with the desired element ratio can be produced with a high probability, improvement in the yield at the time of manufacture can be realized.

BRIEF DESCRIPTION OF THE DRAWINGS

FIGS. 4(a) and 4(b) are diagrams for explaining the vibration of an atom caused by a non-adiabatic process.

FIG. 5 is a diagram showing an example of achieving the invention with photo CVD.

FIG. 6 is a diagram showing the electronic emission spectrum of a compound semiconductor when the wavelength of propagation light for desorption is 457 nm.

FIG. 7 is a diagram showing the electronic emission spectrum of a compound semiconductor when the wavelength of propagation light for desorption is 532 nm.

MODE FOR CARRYING OUT THE INVENTION

Embodiments of the present invention will be described below in detail.

Figure 1:
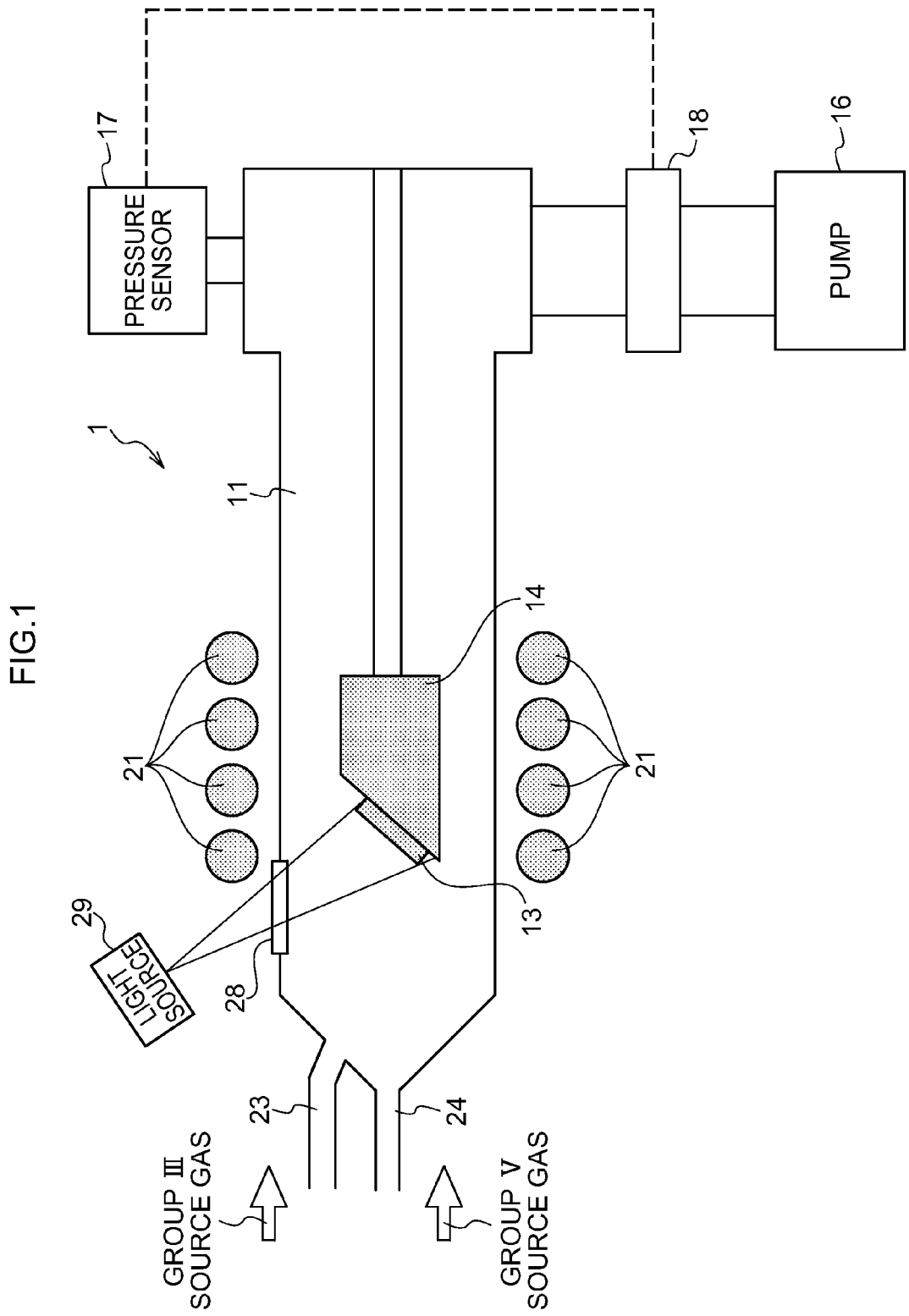
FIG. 1 is a diagram showing a crystal growth apparatus for achieving a compound semiconductor deposition method to which the invention is adapted.

FIG. 1 schematically shows a crystal growth apparatus 1 for achieving a compound semiconductor deposition method to which the invention is adapted.

The crystal growth apparatus 1 is used in a so-called MOCVD (Metal Organic Chemical Vapor Deposition). The crystal growth apparatus 1 has a substrate 13 and a stage 14 for mounting the substrate 13 both disposed within a chamber 11. Gas in the chamber 11 can be sucked with a pump 16, and pressure in the chamber 11 can be detected with a pressure sensor 17. A butterfly valve 18 is automatically opened or closed based on the detected pressure to achieve automatic control of the internal pressure. A supply pipe 23 for supplying a group III source gas to the chamber 11, and a supply pipe 24 for supplying a group V source gas to the chamber 11 are connected to the chamber 11. A window 28 is formed in the outer wall of the chamber 11 so that propagation light emitted from a light source 29 disposed outside the chamber 11 enters the chamber 11 through the window 28. A heat source 21 is provided around the chamber 11 to heat the substrate 13.

The light source 29 optically oscillates based on a drive power supplied from a power supply unit (not shown) to emit light. Examples of the light source 29 include various lasers, such as a fixed laser of Nd:YAG or the like, a semiconductor laser of GaAs or the like, and a gas laser of ArF or the like, an LED and a xenon lamp. The light source 29 may be configured so that its wavelength is controllable.

The following will describe a method of depositing InGaN as an example of a compound semiconductor of a ternary or higher system on the substrate 13 using the crystal growth apparatus 1 with the aforementioned configuration.

First, the substrate 13 is mounted on the stage 14. The substrate 13 is supposed to be a hexagonal crystal sapphire substrate or the like, but is not restrictive, and silicon may be used, for example. In addition, substrates of glass, gallium arsenide, gallium nitride, polyimide, etc. may be used as well.

Next, the gas in the chamber 11 is sucked with the pump 16, and the pressure in the chamber 11 is controlled to a predetermined pressure using the butterfly valve 18 or the like. By the way, this pressure is set to $1.0 \times 10^{-10}$ to $1.0 \times 10^3$ Torr. In addition, the temperature of the substrate 13 mounted on the stage 14 is regulated to a predetermined temperature.

Next, a group III source gas is supplied into the chamber 11 through the supply pipe 23, and a group V source gas is supplied into the chamber 11 through the supply pipe 24. The temperature in the chamber 11 at the time of supplying those source gases is set to 0° C. or higher. The group III source gas may be any gas containing a group III element, and a trimethyl gallium $((CH_3)_3Ga)$ gas and a triethyl indium $((C_2H_5)_3In)$ gas are used as examples of the group III source gas in the following description. The group V source gas may be any gas containing a group V element, and a case where ammonia $(NH_3)$ gas is used will be described as an example of the group V source gas in the following description. The trimethyl gallium gas constitutes the Ga element in the compound semiconductor InGaN, and the triethyl indium gas constitutes the In element in the compound semiconductor InGaN. The ammonia gas constitutes the N element in the compound semiconductor InGaN.

The trimethyl gallium gas and the triethyl indium gas use hydrogen as a carrier gas. That is, a liquid of the trimethyl gallium or triethyl indium is put in a cylinder, the pressure in the cylinder is set to 100 Torr, the temperature of the cylinder is set to −10° C., and a hydrogen gas is supplied into the cylinder as a carrier. The liquid trimethyl gallium or triethyl indium in the cylinder where the hydrogen gas is supplied is vaporized to be a trimethyl gallium gas or triethyl indium gas, which is supplied into the chamber 11 via the supply pipe 24.

The flow rate ratios of the trimethyl gallium gas and the triethyl indium gas to the ammonia gas may be set to 1:1000 or greater. For example, the trimethyl gallium gas may be 0.5 sccm, the triethyl indium gas may be $2.5 \times 10^{-3}$, and the ammonia gas may be 2000 sccm. Particularly, the ammonia gas has a lower absorption to light to be irradiated than the trimethyl gallium gas. When the flow rate ratio of the trimethyl gallium gas to the ammonia gas is less than 1:1000, the amount of the ammonia gas becomes smaller, so that the amount of nitrogen molecules to be dissociated by the irradiated light becomes relatively lower as compared with the gallium atom or the indium atom.

Further, a group III source gas and a group V source gas are supplied into the chamber 11, and propagation light from the light source 29 is irradiated onto the substrate 13 through the window 28. The wavelength of the propagation light to be irradiated onto the substrate 13, i.e., the energy of the propagation light is determined beforehand based on the desired ideal excitation energy of a compound semiconductor to be formed on the substrate 13 after this. In other words, the energy of the propagation light is determined beforehand based on the ideal excitation energy which is computed from the element ratio of the compound semiconductor to be formed on the substrate 13 after this.

Figure 2:
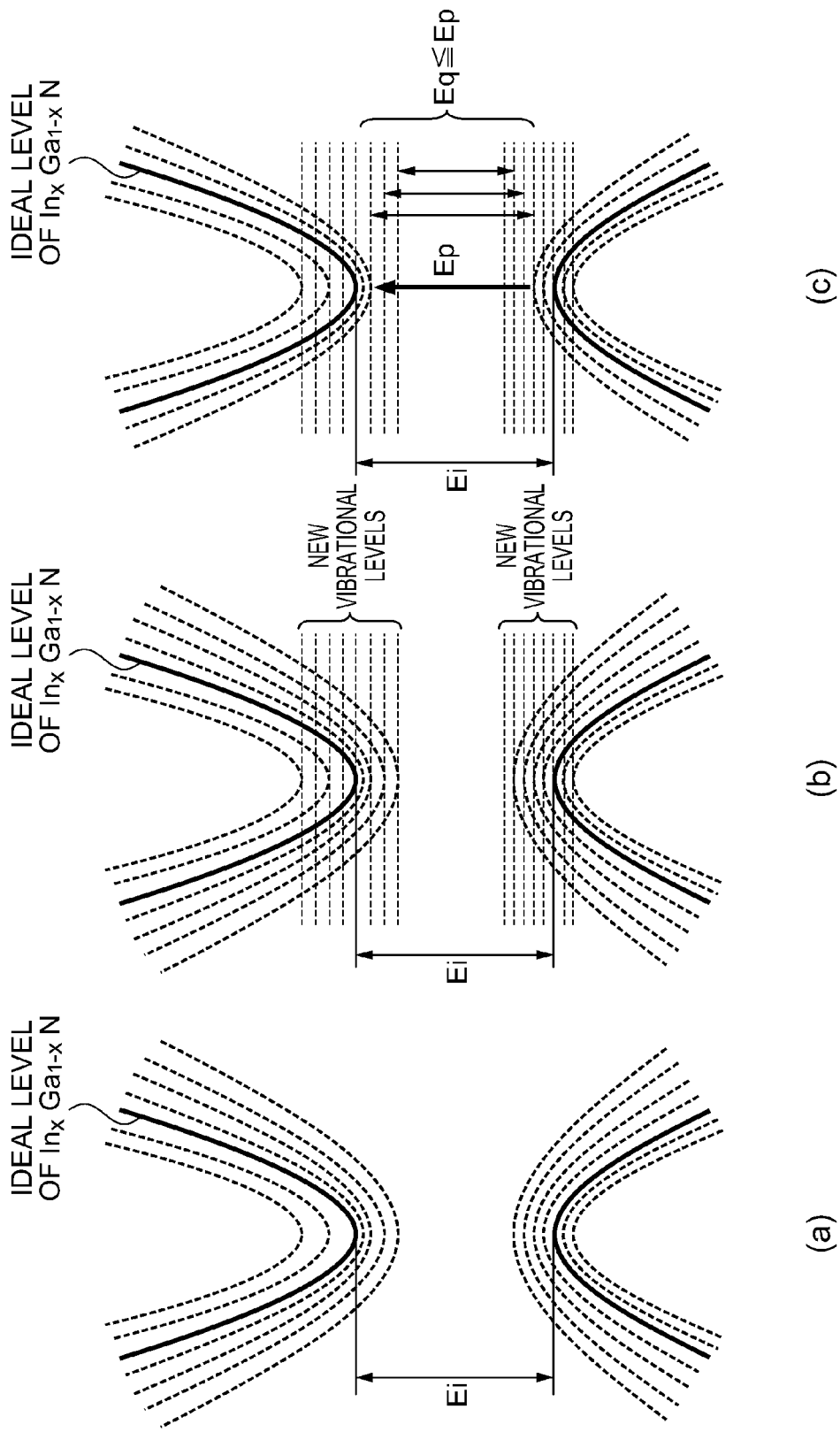
FIGS. 2(a) to 2(c) are diagrams for explaining the operational advantages of the compound semiconductor deposition method to which the invention is adapted.

Such gas supply and such light irradiation bring about the actions to be described below. The solid line in FIG. 2(a) shows the ideal energy level of $In_xGa_{1-x}N$. Let the excitation energy of the ideal energy level of $In_xGa_{1-x}N$ be $E_i$. In general, in $In_xGa_{1-x}N$, the blend ratio of In to Ga is determined through x, and the luminous wavelength (energy) is determined specifically. That is, the element ratio x is designed beforehand so that light to be emitted from $In_xGa_{1-x}N$ to be produced after this has a desired energy.

In the case where $In_xGa_{1-x}N$ based on the element ratio x determined beforehand in the above manner is actually deposited on a substrate by the conventional MOCVD or photo CVD, the element ratio x cannot be controlled finely and cannot therefore be made constant. As a result, energy levels indicated by dotted lines in FIG. 2(a) are formed in multiple stages according to a slight deviation of the element ratio x, beside the ideal energy level of $In_xGa_{1-x}N$ computed from the element ratio x, indicated by the solid line in FIG. 2(a). The energy levels lower than the energy level indicated by the solid line in FIG. 2(a) belong to compound semiconductors in which In is blended extra. The energy levels higher than the energy level indicated by this solid line belong to compound semiconductors in which In is contained less and Ga is blended extra accordingly. Since many compound semiconductors including those components where In, etc. are blended extra are produced, there is an extremely low probability that a compound semiconductor having the ideal energy level of $In_xGa_{1-x}N$ indicated by the solid line among the whole compound semiconductors can be obtained.

Figure 3:
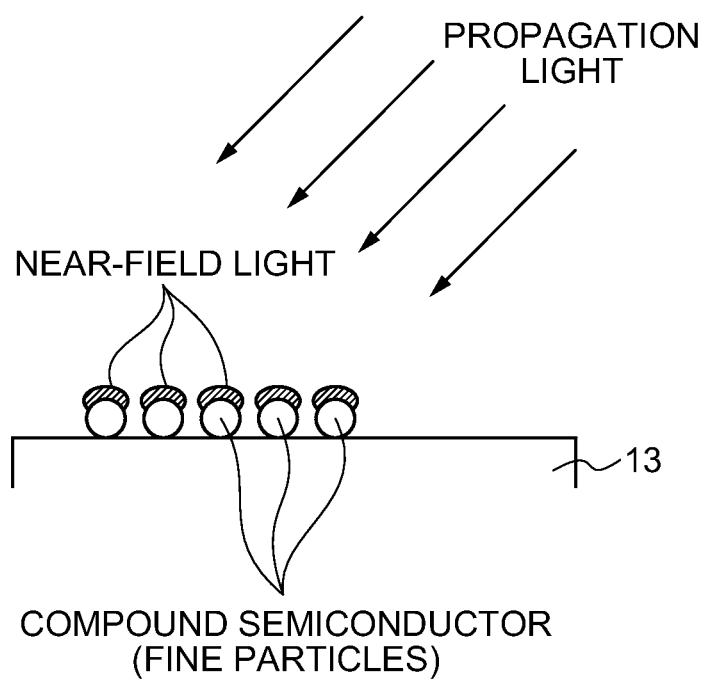
FIG. 3 is a diagram showing an example of generating near-field light based on fine particles.

According to the invention, by way of contrast, irradiation of propagation light is defined as an essential condition at the time of depositing fine particles of a compound semiconductor of a ternary or higher system on the substrate 13 as shown in FIG. 3. Consequently, near-field light is generated from the fine particles of the compound semiconductor deposited on the substrate 13 based on the irradiated propagation light.

When the near-field light is generated, as shown in FIG. 2(b), new vibrational levels are formed in multiple stages. The mechanism for generating the new vibrational levels is such that atoms vibrate against each other in a non-adiabatic process based on the near-field light.

The non-adiabatic process can be thought as a model where bonding between atoms is replaced with a spring as shown in FIGS. 4(a) and 4(b). Generally, the wavelength of propagation light is considerably greater than the size of a molecule, so that the wavelength can be spatially regarded as a uniform electric field in the molecular level. As a result, adjoining electrons are vibrated at the same amplitude and in the same phase by the spring, as shown in FIG. 4(a). Since the atomic nucleus of a dye is heavy, it cannot follow up the vibration of electrons, so that molecular vibration is very unlikely to occur with propagation light. Since involvement of molecular vibration to the process of exciting electrons can be neglected for propagation light, this process is called a adiabatic process (see Non-patent document 1).

Meanwhile, the gradation of the spatial electric field of near-field light drops very sharply. Accordingly, the near-field light applies different vibrations to adjoining electrons, and the different vibrations of electrons cause a heavy atomic nucleus to vibrate as shown in FIG. 4(b). Molecular vibration caused by near-field light is equivalent to the energy taking the form of molecular vibration, so that new vibrational levels are formed in multiple stages as shown in FIG. 2(b) as mentioned above.

At this time, propagation light to be irradiated onto the substrate 13 can be excited through the newly formed vibrational levels. The excitation of the propagation light is carried out through the vibrational level having an excitation energy equal to or smaller than the energy of the propagation light. When the energy of the propagation light is $E_p$ as shown in FIG. 2(c), for example, the propagation light is excited through the vibrational level that has an excitation energy $E_q$ equal to or smaller than the energy $E_p$. Consequently, a component in the compound semiconductor which corresponds to the excitation energy $E_q$ equal to or smaller than the energy $E_p$ can be excited to be desorbed. In an example of InGaN, the component corresponding to the excitation energy $E_q$ equal to or smaller than the energy $E_p$ is equivalent to a component which contains In more as compared with the ideal element ratio. Consequently, it is possible to selectively desorb a component which contains In more.

In other words, according to the invention, any component in a compound semiconductor which is equal to or smaller than the energy $E_p$ of propagation light can be desorbed. As a result, the energy state of the compound semiconductor to be produced finally is free of a component which is equal to or smaller than the energy $E_p$, i.e., the energy can be comprised only of components which are greater than the energy $E_p$.

Since the energy $E_p$ is determined through the wavelength of propagation light, any of the energies of compound semiconductors which are obtained by determining the wavelength of the propagation light is free of a component which is equal to or smaller than the energy $E_p$, i.e., the energy can be comprised only of components which are greater than the energy $E_p$. With the energy $E_p$ of propagation light being set in the relation of the ideal energy level of $In_xGa_{1-x}N$ with the excitation energy $E_i$, therefore, the energy state of a compound semiconductor to be produced finally can be optimized within the relation with the excitation energy $E_i$.

For example, as propagation light with the energy $E_p$ slightly smaller than the excitation energy $E_i$ of the ideal energy level of $In_xGa_{1-x}N$ is irradiated, a component corresponding to the excitation energy $E_q$ equal to or smaller than the energy $E_p$ can be excited to be desorbed as shown in FIG. 2(c). This can result in desorption of a component in the compound semiconductor which is equivalent to be equal to or smaller than the energy $E_p$ which is smaller than the excitation energy $E_i$ of the ideal energy level of $In_xGa_{1-x}N$, so that the components of the compound semiconductor to be obtained last can be adjusted in such a way as to be components according to the ideal excitation energy $E_i$.

According to the invention, therefore, the element ratio of each element constituting a compound semiconductor of a ternary system can be adjusted with high accuracy, and a nanometer-order deviation of the wavelength of an LED including the obtained compound semiconductor can be overcome. In addition, it is possible to produce a compound semiconductor including components according to the excitation energy $E_i$ of the ideal energy level with a high probability, and improve the yield of compound semiconductors to be produced.

That is, according to the compound semiconductor deposition method to which the invention is adapted, propagation light of the energy $E_p$ smaller than the desired ideal excitation energy $E_i$ of the compound semiconductor is irradiated onto the substrate 13 while depositing the compound semiconductor on the substrate 13 to generate near-field light based on the irradiated propagation light from the fine particles of the compound semiconductor deposited on the substrate. Then, new vibrational levels for the compound semiconductor are formed in multiple stages based on the generated near-field light, and the compound semiconductor is excited with the propagation light through a vibrational level, among the new vibrational levels, which has an excitation energy $E_q$ equal to or smaller than the energy $E_p$ of the propagation light. As a result, a component in the compound semiconductor corresponding to the excitation energy $E_q$ is excited with the propagation light so as to be desorbed, and eventually, a component corresponding to an energy smaller than the ideal excitation energy $E_i$ can be removed.

The invention is not limited to the foregoing embodiment. A compound semiconductor may be a compound semiconductor of a quaternary system in place of a compound semiconductor of a ternary system. That is, the compound semiconductor deposition method to which the invention is adapted can be applied to any component in a compound semiconductor of a ternary or higher system.

When the ideal element ratio (excitation energy $E_i$) of this compound semiconductor of a ternary or higher system is set freely, the energy (wavelength) of propagation light can be determined according to the set excitation energy $E_i$. While compound semiconductors may be applied to communication as well as LEDs, the desired ideal excitation energy varies according to the applications. According to the invention, however, the element ratio can be controlled finely for any ideal excitation energy by irradiating propagation light whose energy is smaller than the ideal excitation energy. Since a compound semiconductor with the desired element ratio can be produced with a high probability, it is possible to improve the yield when compound semiconductors are produced.

The invention can be adapted to cases of carrying out sputtering and MBE as well as cases of carrying out thermal CVD including the above-described MOCVD. In such a case, the conventional sputtering apparatus or MBE (Molecular Beam Epitaxy) apparatus should be further equipped with a system of irradiating propagation light onto a substrate.

The invention is also adaptable to, for example, photo CVD. FIG. 5 shows an example in which the invention is adapted to photo CVD. A photo CVD apparatus 2 includes a first light source 31 which irradiates propagation light for deposition and a second light source 32 which irradiates propagation light for desorption. The photo CVD apparatus 2 has a substrate 13 and a stage 14 for mounting the substrate 13 both disposed within a chamber 11. Gas in the chamber 11 can be sucked with a pump 16, and pressure in the chamber 11 can be detected with a pressure sensor 17. A butterfly valve 18 is automatically opened or closed based on the detected pressure to achieve automatic control of the internal pressure. A supply pipe 23 for supplying a group III source gas to the chamber 11, and a supply pipe 24 for supplying a group V source gas to the chamber 11 are connected to the chamber 11. A window 28 is formed in the outer wall of the chamber 11 so that propagation lights emitted from the first light source 31 and the second light source 32 which are disposed outside the chamber 11 enter the chamber 11 through the window 28.

To avoid the redundant description, like or same reference numerals are given to those constituting elements and members of the photo CVD apparatus 2 which are the same as the corresponding components of the crystal growth apparatus 1.

The first light source 31 is similar to a light source used in ordinary photo CVD; for example, ultraviolet lamps including a low-pressure mercury lamp, high-pressure xenon lamp, and deuterium lamp are used. An excimer laser of ArF with a wavelength of 193 nm, KrF with a wavelength of 248 nm, or XeF with a wavelength of 351 nm, YAG laser having a near-infrared wavelength, or the like may be used as the first light source 31.

The light irradiated from the first light source 31 photodisintegrates the source gas, and radicals generated as a consequence are recombined on the substrate 13 to form a thin film thereon.

Based on the light irradiated from the first light source 31, near-field light is generated from fine particles of the compound semiconductor deposited on the substrate 13.

When the near-field light is generated, atoms vibrate against each other in a non-adiabatic process, and new vibrational levels are formed in multiple stages as shown in FIG. 2(b).

At this time, propagation light is irradiated onto the substrate 13 from the second light source 32. The propagation light irradiated from the second light source 32 can be excited through the newly formed vibrational levels. When the energy of the propagation light irradiated from the second light source 32 is $E_p$, the propagation light is excited through the vibrational level that has an excitation energy $E_q$ equal to or smaller than the energy $E_p$.

Consequently, a component in the compound semiconductor which corresponds to the excitation energy $E_q$ equal to or smaller than the energy $E_p$ can be excited to be desorbed.

Propagation light for desorption of the energy smaller than the desired ideal excitation energy of the compound semiconductor is irradiated onto the substrate 13 from the first light source 31 while depositing the compound semiconductor on the substrate 13 to generate near-field light based on the irradiated propagation light for deposition from the fine particles of the compound semiconductor deposited on the substrate 13. Then, new vibrational levels for the compound semiconductor are formed in multiple stages based on the generated near-field light, and a component in the compound semiconductor corresponding to the excitation energy is excited to be desorbed with the propagation light for desorption through a vibrational level, among the new vibrational levels, which has an excitation energy equal to or smaller than the energy of the propagation light for desorption. Accordingly, as in the case of photo CVD, the element ratio of each element constituting a compound semiconductor of a ternary or higher system can be adjusted with high accuracy, and a nanometer-order deviation of the luminous wavelength of an LED including the obtained compound semiconductor can be overcome.

Although it is essential to form new vibrational levels in multiple stages for a compound semiconductor based on the generated near-field light in the foregoing configurations, the essential point is not restrictive. The compound semiconductor deposition apparatus may be configured to simply irradiate propagation light alone. In this case, propagation light with an energy smaller than the desired ideal excitation energy of a compound semiconductor is irradiated onto the substrate 13 while depositing the compound semiconductor on the substrate 13. Then, a component in the compound semiconductor which corresponds to the excitation energy equal to or smaller than the energy of the propagation light is excited to be desorbed with the propagation light. Since the generation of near-field light is not a feature of the invention, new vibrational levels are not formed in multiple stages, but a component in the compound semiconductor which corresponds to the excitation energy equal to or smaller than the energy of the propagation light irradiated can be excited to be desorbed with the propagation light. This brings about the same advantages as the foregoing embodiments.

Example 1

The following will describe an example of a compound semiconductor of InGaN produced by the crystal growth apparatus 1 with the above-described configuration using the compound semiconductor deposition method to which the invention is adapted.

The deposition conditions were the use of the photo CVD apparatus 2 as shown in FIG. 5 and the use of, for example, a trimethyl gallium gas of 0.5 sccm, a triethyl indium gas of $2.5 \times 10^{-3}$ and an ammonia gas of 2000 sccm. The substrate temperature was set to room temperature, propagation light for deposition emitted from the first light source 31 had a wavelength of 213 nm, and propagation light for desorption emitted from the second light source 32 had wavelengths of 457 nm and 532 nm. The emission intensity of the compound semiconductor produced was measured at a measurement temperature of 5K.

FIG. 6 shows the electronic emission spectrum of the compound semiconductor when the wavelength of propagation light for desorption is 457 nm. FIG. 7 shows the electronic emission spectrum of the compound semiconductor when the wavelength of propagation light for desorption is 532 nm. FIGS. 6 and 7 also show the electronic emission spectra when only propagation light for deposition is irradiated for comparison.

As shown in FIGS. 6 and 7, it is understood that the irradiation of propagation light for desorption lowers the spectrum intensity in the region equal to or greater than the wavelength of the propagation light for desorption, i.e., the region equal to or smaller than the energy of the propagation light for desorption. This seems to have occurred because the irradiation of propagation light for desorption desorbs a component in a compound semiconductor equal to or smaller than that energy, lowering the emission intensity in the region.

It is understood from the aforementioned results that according to the compound semiconductor deposition method to which the invention is adapted, a component in the compound semiconductor corresponding to the excitation energy can be excited to be desorbed with propagation light for desorption through a vibrational level which has an excitation energy equal to or smaller than the energy of the propagation light for desorption.

DESCRIPTION OF REFERENCE NUMERALS

1: Crystal growth apparatus
11: Chamber
13: Substrate
14: Stage
16: Pump
17: Pressure sensor
18: Butterfly valve
21: Heat source
23, 24: Supply pipe
28: Window
29: Light source

What is claimed is:

1. A compound semiconductor deposition method of depositing a compound semiconductor of a ternary or higher system on a substrate, the method comprising:

irradiating propagation light onto the substrate, a photon energy of the propagation light being smaller than a target band gap energy of the compound semiconductor, the target band gap energy being computed from a desired element ratio of the compound semiconductor, and the propagation light being irradiated onto the substrate while depositing the compound semiconductor on the substrate; and exciting a component in the compound semiconductor with the propagation light to thereby desorb the component, the component corresponding to a band gap energy equal to or smaller than the photon energy of the propagation light.

2. A compound semiconductor deposition method of depositing a compound semiconductor of a ternary or higher system on a substrate, the method comprising:

irradiating propagation light onto the substrate, a photon energy of the propagation light being smaller than a target band gap energy of the compound semiconductor, the target band gap energy being computed from a desired element ratio of the compound semiconductor, and the propagation light being irradiated onto the substrate while depositing the compound semiconductor on the substrate;

generating near-field light based on the irradiated propagation light from fine particles of the compound semiconductor deposited on the substrate, thereby forming new vibrational levels for the compound semiconductor in multiple stages based on the generated near-field light; and exciting a component in the compound semiconductor with the propagation light through a vibrational level, among the new vibrational levels, to thereby desorb the component, the component corresponding to a band gap energy of the vibrational level which has a band gap energy equal to or smaller than the photon energy of the propagation light.

3. A compound semiconductor deposition method of depositing a compound semiconductor of a ternary or higher system on a substrate by promoting a photochemical reaction through irradiation by a first light source of propagation light for deposition to a gas supplied into a reaction chamber, the method comprising:

irradiating propagation light for desorption by a second light source, wherein a photon energy of the propagation light for desorption is smaller than a target band gap energy of the compound semiconductor, the target band gap energy being computed from a desired element ratio of the compound semiconductor, and wherein the propagation light for desorption is irradiated onto the substrate while depositing the compound semiconductor on the substrate;

generating near-field light based on the propagation light for deposition irradiated by the first light source from fine particles of the compound semiconductor deposited on the substrate, thereby forming new vibrational levels for the compound semiconductor in multiple stages based on the generated near-field light; and exciting a component in the compound semiconductor with the propagation light for desorption irradiated by the second light source through a vibrational level, among the new vibrational levels, to thereby desorb the component, the component corresponding to an excitation a band gap energy of the vibrational level which has a band gap energy equal to or smaller than the photon energy of the propagation light for desorption.

4. A compound semiconductor deposition apparatus for depositing a compound semiconductor of a ternary or higher system on a substrate, the apparatus comprising:

a light source which irradiates propagation light, a photon energy of the propagation light being smaller than a target band gap energy of the compound semiconductor, the target band gap energy being computed from a desired element ratio of the compound semiconductor, and the propagation light being irradiated onto the substrate while depositing the compound semiconductor on the substrate;

wherein the irradiated propagation light excites a component in the compound semiconductor to thereby desorb the component, the component corresponding to a band gap energy equal to or smaller than the photon energy of the propagation light.

5. A compound semiconductor deposition apparatus for depositing a compound semiconductor of a ternary or higher system on a substrate, the apparatus comprising:

a light source which irradiates propagation light, a photon energy of the propagation light being smaller than a target band gap energy of the compound semiconductor, the target band gap energy being computed from a desired element ratio of the compound semiconductor, and the propagation light being irradiated onto the substrate while depositing the compound semiconductor on the substrate;

wherein the light source irradiates the propagation light onto the substrate so as to (i) generate near-field light from fine particles of the compound semiconductor deposited on the substrate, (ii) form new vibrational levels for the compound semiconductor in multiple stages based on the generated near-field light, and (iii) excite a component in the compound semiconductor through a vibrational level, among the new vibrational levels, to thereby desorb the component, the component corresponding to a band gap energy of the vibrational level which has a band gap energy equal to or smaller than the photon energy of the propagation light.

6. A compound semiconductor deposition apparatus for depositing a compound semiconductor of a ternary or higher system on a substrate by promoting a photochemical reaction through irradiation of propagation light for deposition to a gas supplied into a reaction chamber, the apparatus comprising:

a first light source which irradiates the propagation light for deposition; and a second light source which irradiates propagation light for desorption;

wherein photon energy of the propagation light for desorption is smaller than a target band gap energy of the compound semiconductor, the target band gap energy being computed from a desired element ratio of the compound semiconductor, and the propagation light being irradiated onto the substrate while depositing the compound semiconductor on the substrate;

wherein the propagation light for deposition irradiated by the first light source generates near-field light from fine particles of the compound semiconductor deposited on the substrate, and forms new vibrational levels for the compound semiconductor in multiple stages based on the generated near-field light; and wherein the propagation light for desorption irradiated by the second light source excites a component in the compound semiconductor through a vibrational level, among the new vibrational levels, to thereby desorb the component, the component corresponding to a band gap energy of the vibrational level which has a band gap energy equal to or smaller than the photon energy of the propagation light for desorption.

* * * * *